United States Patent
Rouh et al.

(10) Patent No.: US 7,947,559 B2
(45) Date of Patent: May 24, 2011

(54) METHOD OF FABRICATING SEMICONDUCTOR DEVICE

(75) Inventors: Kyoung Bong Rouh, Goyang-si (KR); Dong Seok Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 284 days.

(21) Appl. No.: 11/966,194

(22) Filed: Dec. 28, 2007

(65) Prior Publication Data

US 2009/0004837 A1   Jan. 1, 2009

(30) Foreign Application Priority Data

Jun. 29, 2007  (KR) .......................... 10-2007-0065834

(51) Int. Cl.
*H01L 21/336* (2006.01)
(52) U.S. Cl. ................ 438/300; 257/E21.428
(58) Field of Classification Search ............ 438/300
See application file for complete search history.

(56) References Cited

U.S. PATENT DOCUMENTS

| | | | | |
|---|---|---|---|---|
| 5,759,901 A | * | 6/1998 | Loh et al. | 438/305 |
| 6,297,111 B1 | * | 10/2001 | Krivokapic | 438/302 |
| 6,300,206 B1 | * | 10/2001 | Fukada et al. | 438/303 |
| 7,135,393 B2 | * | 11/2006 | Tagawa | 438/519 |
| 2002/0139992 A1 | * | 10/2002 | Kumar et al. | 257/134 |

FOREIGN PATENT DOCUMENTS

KR   10-1998-0057854   9/1998
KR   10-2000-044662   7/2000

OTHER PUBLICATIONS

Fiory et al., "Transient-Enhanced Diffusion in Shallow Junction Formation," Departmetn of Physics, New Jersey Institute of Technology, Newark, NJ, (2002).
Xia et al., "Studies of Boron Segregation to {311} Defects in Silicon-Implanted Silicon," Jpn. J. Appl. Phys., 38(4B):2319-2323 (1999).

* cited by examiner

*Primary Examiner* — W. David Coleman
(74) *Attorney, Agent, or Firm* — Marshall, Gerstein & Borun LLP

(57) ABSTRACT

Provided is a method of fabricating a semiconductor device having an impurity region with an impurity concentration of a first dose in a substrate. In the method, first impurity ions of a first conductivity type are implanted into the substrate, and a rapid thermal processing (RTP) is performed on the substrate to activate the first impurity ions. Second impurity ions of the first conductivity type are implanted into the substrate having the activated first impurity ions.

12 Claims, 6 Drawing Sheets

FIG. 10

| WF# | ION IMPLANTATION CONDITION | THERMAL TREATMENT CONDITION | SHEET RESISTANCE(Rs) | MAXIMUM DEPTH |
|---|---|---|---|---|
| WF#01 | TILT ANGLE OF 0 DEGREE 100% | 810C 20S | 493.1 | 960 |
| WF#02 | TILT ANGLE OF 0 DEGREE 80% + TILT ANGLE OF 7 DEGREES 20% | 810C 20S | 492.2 | 861 |
| WF#03 | TILT ANGLE OF 0 DEGREE 60% + TILT ANGLE OF 7 DEGREES 40% | 810C 20S | 491.4 | 847 |
| WF#04 | TILT ANGLE OF 0 DEGREE 40% + TILT ANGLE OF 7 DEGREES 60% | 810C 20S | 494.1 | 735 |
| WF#05 | TILT ANGLE OF 0 DEGREE 20% + TILT ANGLE OF 7 DEGREES 80% | 810C 20S | 498.7 | 700 |
| WF#06 | TILT ANGLE OF 7 DEGREES 100% | 810C 20S | 623.8 | 680 |

METHOD OF FABRICATING SEMICONDUCTOR DEVICE

CROSS-REFERENCE TO RELATED APPLICATIONS

The priority of Korean patent application number 10-2007-0065834, filed on Jun. 29, 2007, is hereby claimed and the disclosure thereof is incorporated by reference herein in its entirety.

BACKGROUND OF THE INVENTION

The present invention relates to a method of fabricating a semiconductor device.

Metal oxide semiconductor (MOS) transistors are used in various kinds of semiconductor devices. As one of semiconductor memory devices, a dynamic random access memory (DRAM) includes a plurality of unit cells each having one transistor and one capacitor. A MOS transistor includes a gate insulating layer and a gate electrode, which are sequentially formed on a substrate having impurity regions, e.g., a source region and a drain region. A channel region is defined between the impurity regions. When a bias voltage is applied to the gate electrode, an inversion layer is formed in the channel region and carriers move through the inversion layer.

As a semiconductor device becomes more highly integrated, the transistor is scaled down and the channel length of the transistor is reduced. It is well known that the performance of the transistor is degraded due to a short channel effect caused by the reduced channel length. Various methods have been used for suppressing the short channel effect. One method is to form a shallow impurity region in a substrate. In forming the shallow impurity region, the implantation depth of impurity ions must be reduced during impurity ion implantation. In addition, the dose of the impurity ions to be implanted must be reduced. A tilt implantation method has been recently used to implant impurity ions at a tilt angle of, e.g., 7 degrees instead of 0 degree.

The shallow ion implantation method is vulnerable to dopant loss at a surface or junction interface whereby the implanted impurity ions are not sufficiently diffused. Hence, sheet resistance within the impurity region increases. In addition, when the dose for the shallow impurity region is reduced, an amount of activated dopants is reduced and thus the sheet resistance further increases. Moreover, dopant loss may also occur at the gate insulating layer by a thermal treatment performed after the ion implantation for the formation of the impurity region. This dopant loss occurs more seriously in a recess gate structure adopted for suppressing the short channel effect. That is, the dopant loss occurs in a recess etching process of forming the recess gate structure and the dopant loss occurs in sidewalls of the recess gate during a subsequent thermal treatment. The dopant loss increases the sheet resistance within the impurity region, degrading the performance of the transistor.

SUMMARY OF THE INVENTION

Embodiments of the present invention are directed to a method of fabricating a semiconductor device that can suppress a dopant loss, thereby reducing a sheet resistance.

In one embodiment, a method of fabricating a semiconductor device having an impurity region with an impurity concentration of a first dose in a substrate includes: implanting first impurity ions of a first conductivity type into the substrate; performing a rapid thermal processing (RTP) on the substrate to activate the first impurity ions; and implanting second impurity ions of the first conductivity type into the substrate having the activated first impurity ions.

The method may include implanting impurity ions of a second conductivity type into the substrate so as to adjust a channel threshold voltage before implanting the first impurity ions.

The first impurity ions preferably includes arsenic (As).

The second impurity ions preferably includes arsenic (As) or phosphorus (P).

A dose in the implantation of the first impurity ions may be set to a second dose corresponding to a fraction of the first dose, and a dose in the implantation of the second impurity ions may be set to a third dose corresponding to the difference between the second dose and the first dose.

The second dose and the third dose preferably are set at approximately 50% of the first dose.

The implanting of the first impurity ions preferably includes: dividing a total dose of the first impurity ions by at least two; and implanting the divided doses of the first impurity ions at least two different tilt angles.

The different tilt angles preferably includes 0 degree and 7 degrees.

The rapid thermal processing preferably includes a rapid thermal processing using a lamp.

The rapid thermal processing using the lamp preferably is performed at a temperature rise rate of at least 50° C./sec.

The implanting of the second impurity ions preferably includes: dividing a total dose of the second impurity ions by at least two; and implanting the divided doses of the second impurity ions at different tilt angles.

BRIEF DESCRIPTION OF THE DRAWINGS

FIG. 10 illustrates a graph of a sheet resistance and a maximum ion implantation depth with respect to an ion implantation tilt angle.

DESCRIPTION OF SPECIFIC EMBODIMENTS

Figure 1:
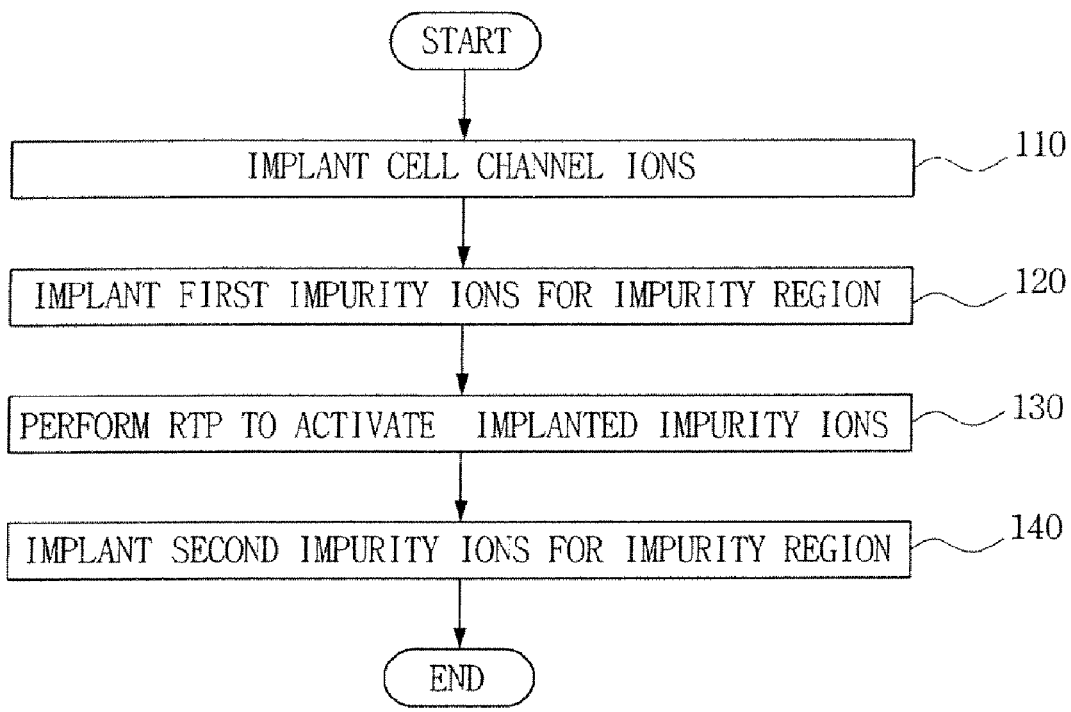
FIG. 1 illustrates a method of fabricating a semiconductor device according to one embodiment of the present invention.
Figure 2:
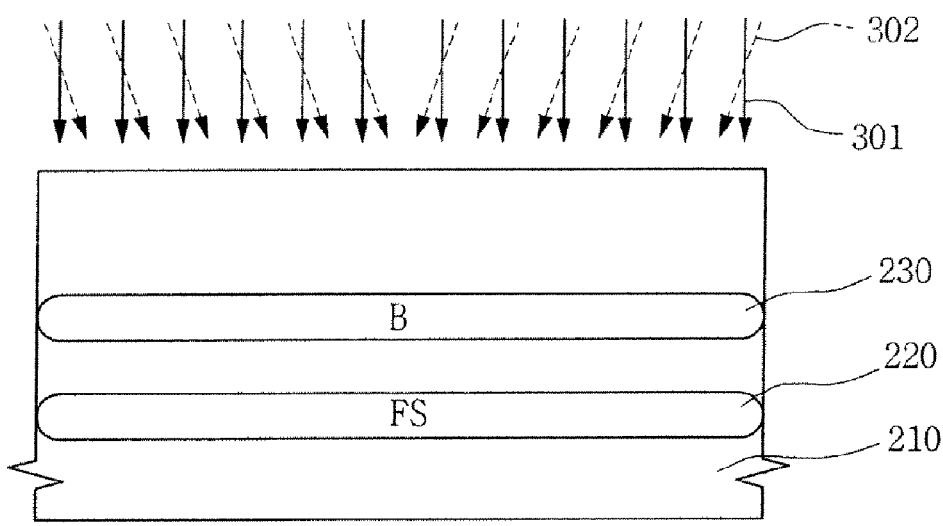
FIGS. 2 to 5 illustrate the fabricating processes of FIG. 1.
Figure 4:
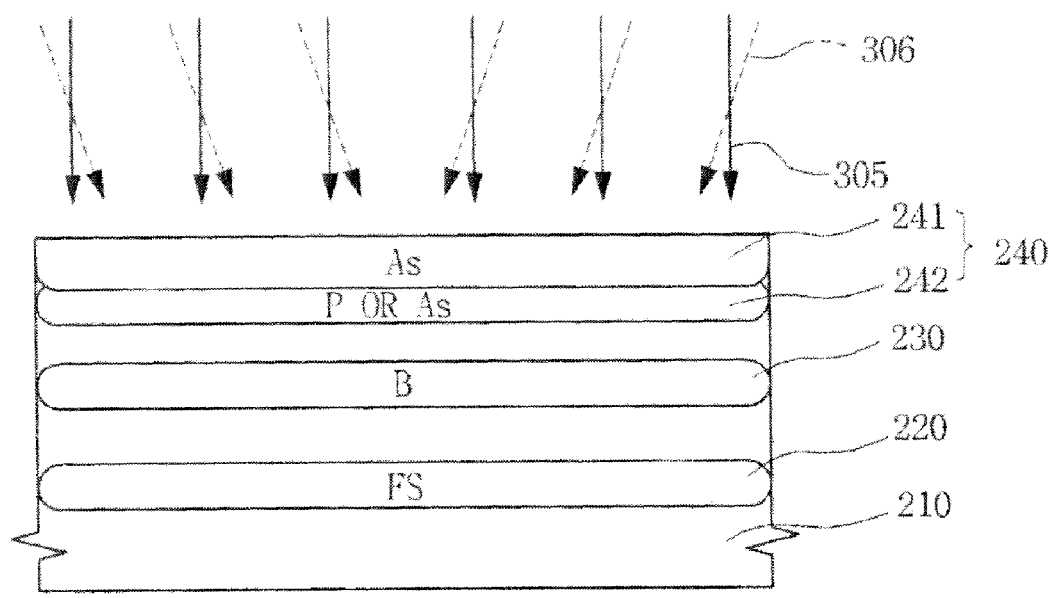
Figure 5:
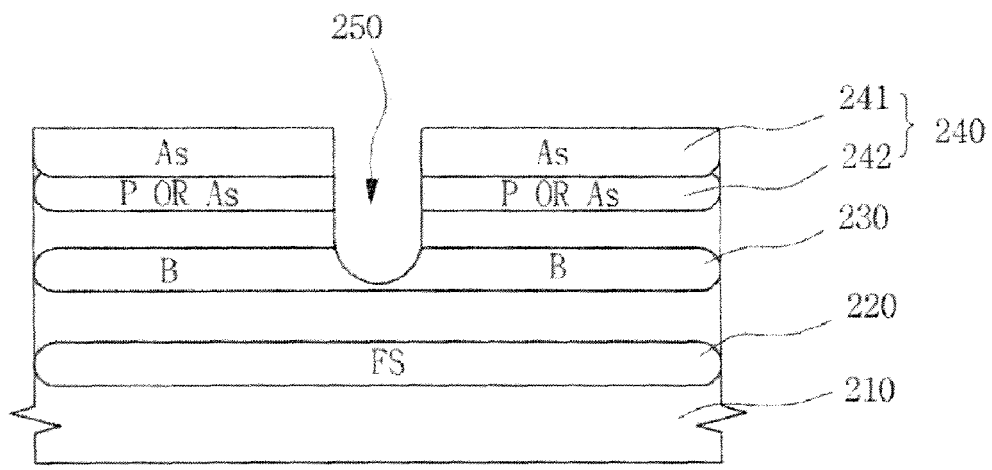
Figure 6:
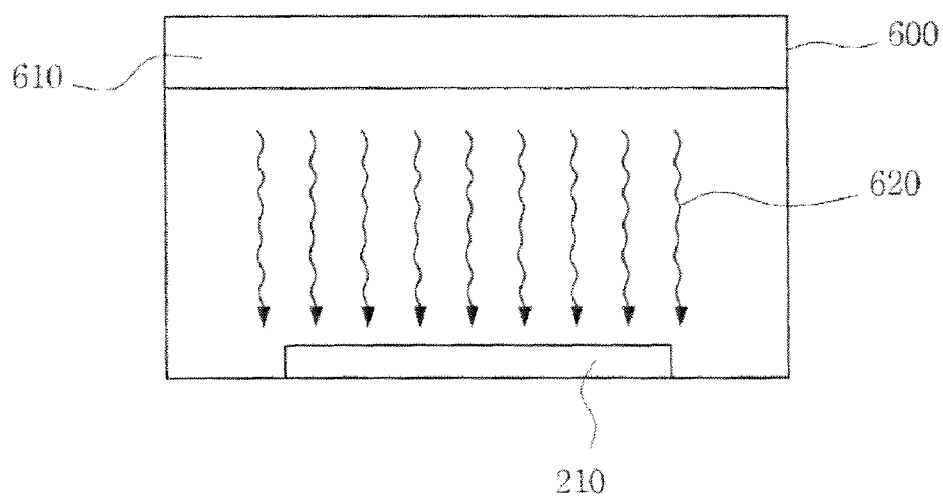
FIG. 6 illustrates an operation 130 of FIG. 1.

FIG. 1 illustrates a method of fabricating a semiconductor device according to one embodiment of the present invention, FIGS. 2 to 5 illustrate the fabricating processes of FIG. 1, and FIG. 6 illustrates an operation 130 of FIG. 1. Referring to FIGS. 1 and 2, a field stop (FS) region 220 is defined within a semiconductor substrate 210 such as a silicon substrate. The FS region 220 may be formed by implanting an appropriate amount of impurity ions, e.g., boron (B), into the semiconductor substrate 210. In operation 110, a threshold voltage adjustment region 230 preferably is formed by a cell channel ion implantation process of implanting impurity ions (e.g., boron (B)) for adjusting a channel threshold voltage into the semiconductor substrate 210. The impurity ions for adjusting the channel threshold voltage preferably are implanted at an ion implantation angle of 0 degree or 7 degrees, for example, which are respectively indicated by arrows 301 and 302. The impurity ions may also be implanted at ion implantation angles of both 0 degree and 7 degrees. In this case, a fraction of a total dose is implanted at the ion implantation angle of 0 degree, and the remaining fraction is implanted at the ion implantation angle of 7 degrees. For example, when the total dose is 3.0E13, a 1.5E13 dose is implanted at the ion implantation angle of 0° and the other 1.5E13 dose is implanted at the ion implantation angle of 7 degrees.

Figure 3:
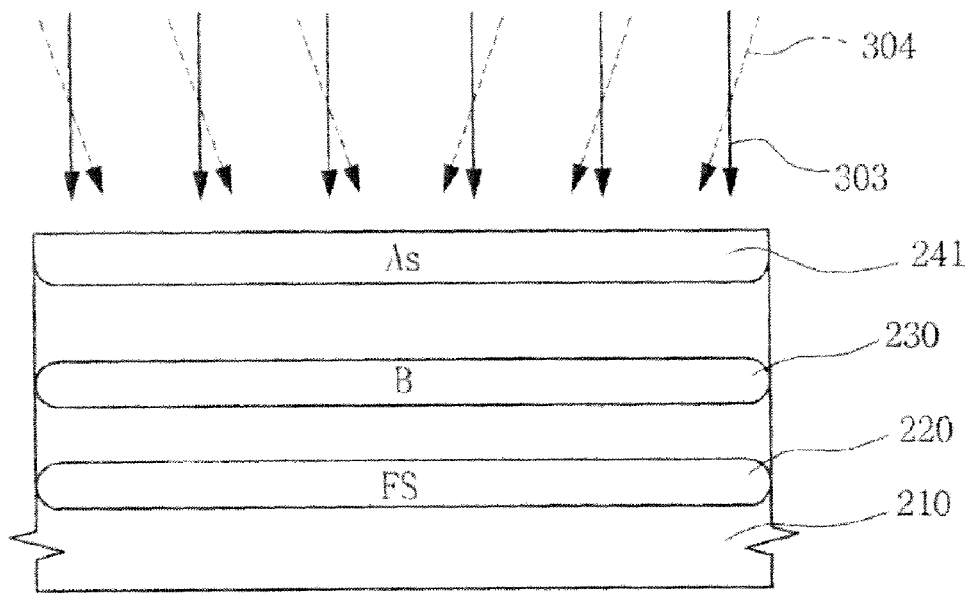

Referring to FIG. 3, first impurity ions are implanted into the semiconductor substrate 210 to form an impurity region in operation 120. Arsenic (As) ions having a first conductivity type (e.g., n-type) preferably are used as the first impurity ions. The first impurity ions may be implanted at an ion implantation angle of 0 degree or at ion implantation angles of 0 degree and 7 degrees, for example. An implantation energy is set to a relatively low level, so that a first impurity region 241 can be formed over the semiconductor substrate 210. A dose of the first impurity ions to be implanted, referred to as a second dose, is set to a portion of the first (total) dose, e.g., 50% of the total dose. Some of the second dose preferably is implanted at an ion implantation angle of 0 degree and the remainder preferably is implanted at an ion implantation angle of 7 degrees. In this way, when the first impurity ions are implanted at both the ion implantation angles of 0 degree and 7 degrees, the sheet resistance can be reduced while maintaining the sufficiently shallow junction depth of the impurity region. Although this embodiment shows that the impurity ions are implanted at only at two tilt angles of 0 degree and 7 degrees, the present invention is not limited thereto. For example, the second dose can be subdivided into three doses, and the three doses can be implanted at three different tilt angles.

After implanting the first impurity ions, a thermal treatment process is performed to activate the first impurity ions in operation 130. Hence, the first impurity ions are activated by the thermal treatment process to form the first impurity region 241 on the surface of the semiconductor substrate 210. The thermal treatment process preferably includes a rapid thermal processing (RTP) using a lamp. Referring to FIG. 6, the semiconductor substrate 210 where the first impurity ions are implanted is loaded into an RTP chamber 600 having a lamp 610 at its upper portion. Then, heat generated from the lamp 610 is made to rapidly increase. The generated heat is transferred to the semiconductor substrate 210 as indicated by arrows 620. A temperature rise rate of the heat generated from the lamp 610 is set to preferably at least 50° C./sec or more. When the first impurity ions are activated by the RTP to form the first impurity region, the semiconductor substrate 210 is unloaded from the RTP chamber 600.

Even though the subsequent thermal treatment process is performed after the impurity ions are diffused by the initial high-temperature thermal treatment, additional diffusion occurs less. Hence, when the first impurity ions are activated by the RTP having a short high-temperature exposure time, the diffusion of the first impurity ions in the subsequent thermal treatment process is suppressed. Therefore, the dopant loss causing the increase of the resistance can be reduced. Arsenic (As) used as the first impurity ions has a relatively lower diffusion rate and higher activation rate than those of phosphorus (P). Compared with the case where the RTP is performed after implanting both arsenic (As) and phosphorus (P), the first impurity ions are less diffused when the RTP is performed after the same total dose of implanting only arsenic (As). Consequently, the dopant loss is relatively reduced.

Referring to FIG. 4, second impurity ions are implanted into the semiconductor substrate 210 to form an impurity region in operation 140. Phosphorus (P) having the first conductivity type (e.g., n-type) preferably is used as the second impurity ions. In other example, arsenic (As) may be used as the second impurity ions. The second impurity ions preferably are implanted at a tilt angle of 0 degree or at two tilt angles of 0 degree and 7 degrees as indicated by arrows 305 and 306, respectively. A dose of the second impurity ions to be implanted is set to a third dose, which is the remaining dose after the second dose of the first impurity ions from the total (first) dose within the desired impurity region is implanted. For example, when the first impurity ions are implanted with the second dose corresponding to 50% of the total dose, the second impurity ions are implanted with the dose of the remaining 50%. The third dose preferably is set to implant 50% of the total third dose at a tilt angle of 0 degree and the remaining 50% of the third dose at a tilt angle of 7 degrees.

When the second impurity ions are implanted at the two tilt angles of 0 degree and 7 degrees, the sheet resistance can be reduced while maintaining a sufficiently shallow junction depth of the impurity region. As described above, phosphorus (P) used as the second impurity ions has a relatively higher diffusion rate than that of arsenic (As). Hence, when an RTP is performed to activate the second impurity ions (i.e., phosphorus (P)), dopant loss may increase due to the high diffusion rate of phosphorus (P). Consequently, the sheet resistance of the impurity region increases. Therefore, the thermal treatment process such as the RTP preferably is not performed after the second impurity ions (e.g., phosphorus (P)) are implanted. A region where the second impurity ions are implanted by a subsequent thermal treatment process is defined as a second impurity region 242. The second impurity region 242 and the first impurity region 241 define the impurity regions 240 such as the source/drain regions. Although this embodiment shows that the impurity ions are implanted at only at two tilt angles of 0 degree and 7 degrees, the present invention is not limited thereto. For example, the second dose can be divided into three doses, and the three doses can be implanted at three different tilt angles.

Referring to FIG. 5, a portion of a semiconductor substrate 210 is etched to a predetermined depth by a typical etching process, thereby forming a recess 250. Although not shown, a gate insulating layer (not shown) is formed within the recess 250 and a gate electrode (not shown) is formed on the gate insulating layer. More specifically, the gate electrode fills the recess and protrudes upward from the semiconductor substrate 210.

Figure 7:
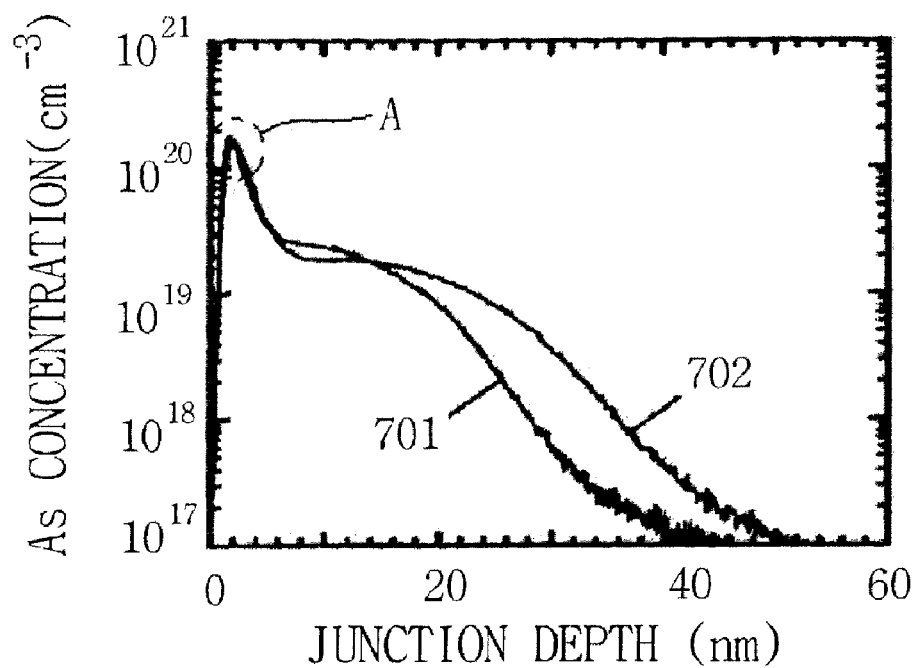
FIG. 7 illustrates a graph of arsenic (As) concentration distribution with respect to a junction depth after a thermal treatment.

FIG. 7 illustrates a graph of arsenic (As) concentration distribution with respect to the junction depth after the thermal treatment process. In FIG. 7, a line 701 represents a case where the thermal treatment process is performed for 5 minutes, and a line 702 represents a case where the thermal treatment process is performed for 30 minutes. As indicated by a reference symbol "A", the two cases have almost no difference in the maximum projection range (Rp) corresponding to the junction depth with a maximum concentration. However, compared with the case 702 where the thermal treatment is performed for a long time, the junction depth becomes shallower in the case 701 where the thermal treatment process is performed for a short time. Therefore, when a lamp RTP having a high temperature rise rate is performed after implanting arsenic (As) as the first impurity ions, it is possible to repair defects and sufficiently obtain the activated dopants while maintaining the maximum injection depth (Rp).

Figure 8:
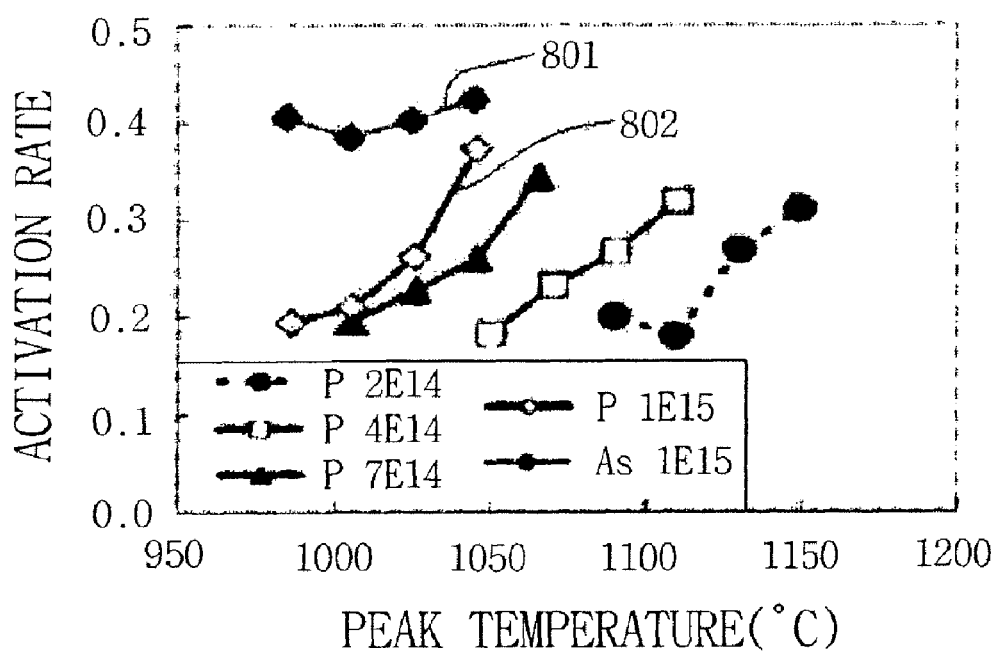
FIG. 8 illustrates a graph of a comparison of an activation rate with respect to temperature of arsenic and phosphorus.

FIG. 8 illustrates a graph of a comparison of an activation rate with respect to temperature for arsenic (As) and phosphorus (P). In FIG. 8, line 801 represents a case wherein the thermal treatment process is performed on arsenic (As), and line 802 represents a case where the thermal treatment process is performed on phosphorus (P) having the same concentration as the arsenic in line 801. As can be seen from the graph, the activation rate of arsenic (As) is higher than that of phosphorus (P) at the same temperature. Accordingly, even though the RTP is performed after implantation of arsenic (As) and no separate high-temperature thermal process is performed after implantation of phosphorus (P), the sufficient activated dopant can be obtained due to the high activation rate of phosphorus (P) and the dopant loss can be minimized by suppressing the diffusion of phosphorus (P).

Figure 9:
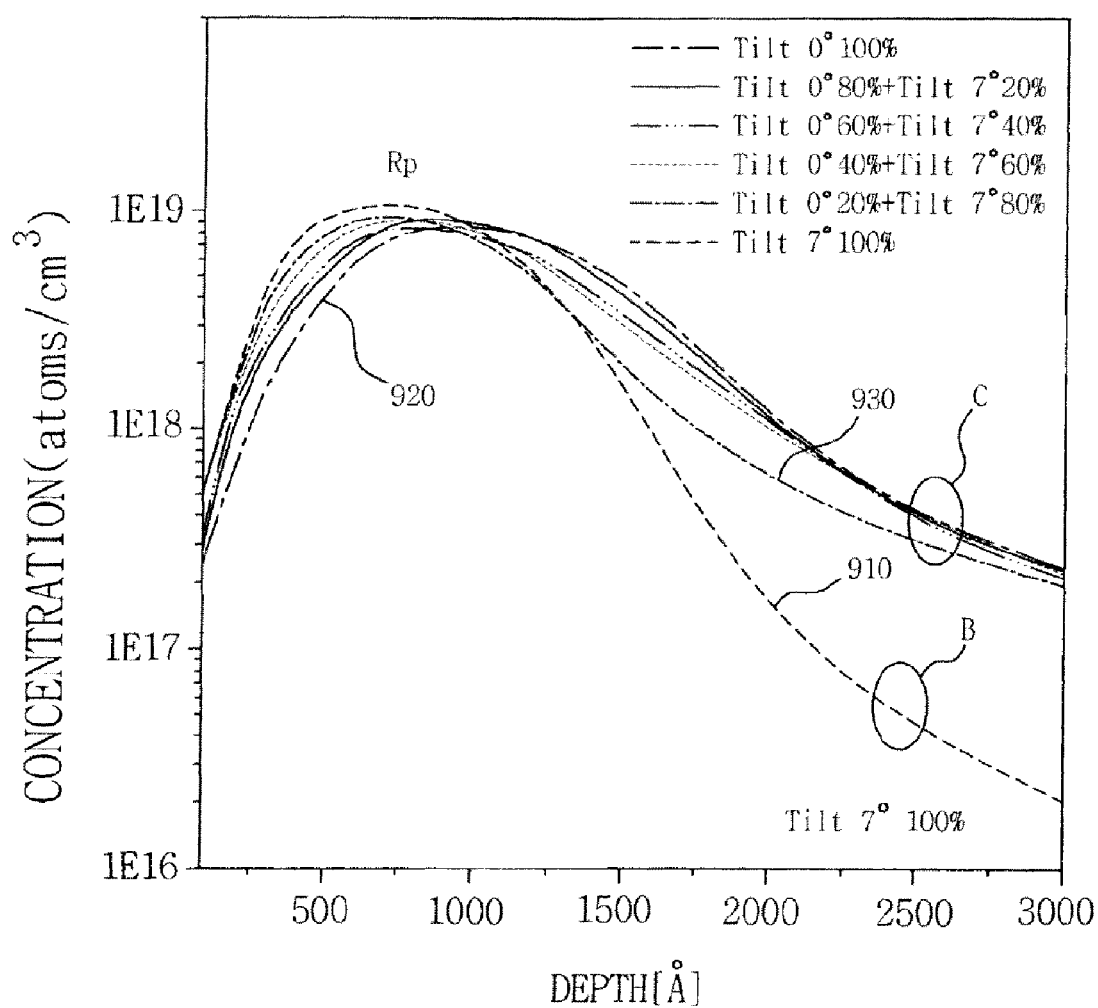
FIG. 9 illustrates a graph of an impurity ion concentration distribution with respect to an ion implantation tilt angle.

FIG. 9 illustrates a graph of an impurity ion concentration distribution with respect to an ion implantation tilt angle. Referring to FIG. 9, in a case 910 where impurity ions are implanted at a tilt angle of 7 degrees, a concentration (or an area) of a tail portion B is relatively low. On the other hand, in cases 920 and 930 where impurity ions are implanted at a tilt angle of 0 degree or at two tilt angles of 0 degree and 7 degrees, a concentration (or an area) of a tail portion C is relatively high, thereby reducing a sheet resistance Rs.

FIG. 10 illustrates a table of sheet resistance and maximum ion implantation depth with respect to ion implantation tilt angle. Referring to FIG. 10, in a case WF#06 where impurity ions are implanted at a tilt angle of 7 degrees, the sheet resistance Rs is 623.8 Ω/cm$^2$ and a peak depth is 680 Å. In a case WF#01 where impurity ions are implanted at a tilt angle of 0 degree or in cases WF#02, WF#03, WF#04 and WF#05 where impurity ions are implanted at two tilt angles of 0 degree and 7 degrees, the sheet resistance Rs is relatively low and the peak depth does not significantly increase.

As described above, the RTP is performed after implantation of arsenic (As) and no separate high-temperature thermal process is performed after implantation of phosphorus (P). In this way, sufficient activated dopant can be obtained due to the high activation rate of arsenic (As) and the dopant loss can be minimized by suppressing the diffusion of phosphorus (P), thereby reducing the sheet resistance within the impurity region. Further, the sheet resistance within the impurity region can be further reduced by implanting arsenic (As) and phosphorus (P) at two tilt angles such as 0 degree and 7 degrees.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a semiconductor device including a source/drain region with an impurity concentration of a first dose in a substrate, the method comprising:
    implanting first impurity ions of a first conductivity type into the substrate;
    performing a rapid thermal processing on the substrate to activate the first impurity ions and form the source/drain region;
    implanting second impurity ions of the first conductivity type into the source/drain region having the activated first impurity ions; and,
    forming a recess for recessed gate in the substrate without any thermal processing on the second impurity ions,
    wherein the recess penetrates the impurity region, whereby the source/drain region is formed by the first impurity region and the second impurity region disposed at both sides of the recess.

2. The method of claim 1, further comprising implanting impurity ions of a second conductivity type into the substrate so as to adjust a channel threshold voltage, before implanting the first impurity ions.

3. The method of claim 1, wherein the first impurity ions comprise arsenic.

4. The method of claim 1, wherein the second impurity ions comprise both arsenic or phosphorus.

5. The method of claim 1, comprising implanting the first impurity ions at a second dose corresponding to a fraction of the first dose, and implanting the second impurity ions at a third dose corresponding to the difference between the first dose and the second dose.

6. The method of claim 1, wherein the implanting of the first purity ions comprises:
    dividing a total dose of the first impurity ions by at least two; and
    implanting the divided doses of the first impurity ions at least two different angles.

7. The method of claim 1, comprising performing the rapid thermal processing with a lamp.

8. The method a wherein the implanting of the second impurity ions comprises:
    dividing a total dose of the second impurity ions by at least two; and
    implanting the divided doses of the second impurity ions at least two different tilt angles.

9. The method of claim 8, comprising implanting the divided doses of the second impurity ions at tilt angles comprising 0 degree and 7 degrees.

10. The method of claim 5, comprising implanting the first impurity ions at a second dose corresponding to approximately 50% of the first dose and implanting the second impurity ions at a third dose corresponding to approximately 50% of the first dose.

11. The method of claim 6, comprising implanting the divided doses of the first impurity ions at tilt angles comprising 0 degree and 7 degrees.

12. The method of claim 7, comprising performing the rapid thermal processing at a temperature rise rate of at least 50° C./sec.

* * * * *